United States Patent
Di Ventra et al.

(10) Patent No.: US 9,570,140 B2
(45) Date of Patent: Feb. 14, 2017

(54) CIRCUIT FOR MIXED MEMORY STORAGE AND POLYMORPHIC LOGIC COMPUTING

(71) Applicants: The Regents of the University of California, Oakland, CA (US); Massimiliano Di Ventra, Carlsbad, CA (US); Fabio Lorenzo Traversa, Barcelona (ES); Yuriy V. Pershin, Columbia, SC (US)

(72) Inventors: Massimiliano Di Ventra, Carlsbad, CA (US); Fabio Lorenzo Traversa, Barcelona (ES); Yuriy V. Pershin, Columbia, SC (US)

(73) Assignees: The Regents of the University of California, Oakland, CA (US); Fabio Lorenzo Traversa, Barcelona (ES); Yuriy V. Pershin, Columbia, SC (US)

( * ) Notice: Subject to any disclaimer, the term of this patent is extended or adjusted under 35 U.S.C. 154(b) by 0 days.

(21) Appl. No.: 14/770,718

(22) PCT Filed: Mar. 7, 2014

(86) PCT No.: PCT/US2014/021960
§ 371 (c)(1),
(2) Date: Aug. 26, 2015

(87) PCT Pub. No.: WO2014/138641
PCT Pub. Date: Sep. 12, 2014

(65) Prior Publication Data
US 2016/0012876 A1   Jan. 14, 2016

Related U.S. Application Data

(60) Provisional application No. 61/774,986, filed on Mar. 8, 2013.

(51) Int. Cl.
*G11C 11/24* (2006.01)
*G11C 11/4091* (2006.01)
(Continued)

(52) U.S. Cl.
CPC ............ *G11C 11/24* (2013.01); *G11C 7/1006* (2013.01); *G11C 11/401* (2013.01);
(Continued)

(58) Field of Classification Search
CPC ...... G11C 11/24; G11C 11/401; G11C 11/404; G11C 7/1006
See application file for complete search history.

(56) References Cited

U.S. PATENT DOCUMENTS

| | | | |
|---|---|---|---|
| 2011/0199814 A1* | 8/2011 | Meade | H01L 27/101 365/149 |
| 2012/0007038 A1* | 1/2012 | Strukov | H01L 27/0207 257/5 |

(Continued)

OTHER PUBLICATIONS

Flak, J., CNN Cell with Memcapacitive Synapses and Threshold Control Circuit, Proceedings of the International Workshop on Cellular Nanoscale Networks and Their Applications, Aug. 29-31, 2012, pp. 1-5.*

Borghetti et al., Memristive' switches enable 'stateful' logic operations via material implication, vol. 464, No. 8 (Apr. 2010), pp. 873-876.

(Continued)

*Primary Examiner* — Hoai V Ho
*Assistant Examiner* — Tri Hoang
(74) *Attorney, Agent, or Firm* — Greer, Burns & Crain, Ltd.; Steven P. Fallon

(57) ABSTRACT

A circuit utilizing memcapacitive elements for mixed memory storage and polymorphic computing is introduced. The circuit includes a plurality of memory cells each selectively or fixedly connected to a word line, bit line and dual bit line. Each memory cell includes a memcapacitive element. Voltage pulse generators can selectively applying voltage pulses to the memory cells. A method for mixed (Continued)

memory storage and polymorphic computing in at least two memory cells is provided. Data is stored by selectively applying voltage pulses to an individual memory cell to set an internal charge level of the memcapacitive element. Logic functions are conducted by applying voltage pulses having independent amplitudes to at least two memory cells to achieve internal charges in the memcapacitive elements of the cells to store an output bit according to a logic map that depends upon applied independent voltage pulse amplitudes.

17 Claims, 18 Drawing Sheets

(51) Int. Cl.

| | |
|---|---|
| G11C 11/406 | (2006.01) |
| H01L 49/02 | (2006.01) |
| G11C 11/401 | (2006.01) |
| G11C 7/10 | (2006.01) |
| G11C 11/404 | (2006.01) |
| H01L 21/28 | (2006.01) |

(52) U.S. Cl.
CPC .......... *G11C 11/404* (2013.01); *G11C 11/406* (2013.01); *G11C 11/4091* (2013.01); *H01L 28/40* (2013.01); *H01L 21/28282* (2013.01)

(56) References Cited

U.S. PATENT DOCUMENTS

| | | | | |
|---|---|---|---|---|
| 2012/0014170 | A1* | 1/2012 | Strukov | G11C 11/24 365/149 |
| 2012/0243297 | A1* | 9/2012 | Katayama | G11C 11/1659 365/148 |
| 2012/0327698 | A1 | 12/2012 | Perner | |
| 2013/0242637 | A1* | 9/2013 | Yang | G11C 13/0002 365/148 |

OTHER PUBLICATIONS

Chua, L.O. et al., "Memristive Devices and Systems", Proceedings of the IEEE, vol. 64, No. 2, (Feb. 1976), pp. 209-223.
Di Ventra M. et al., "Circuit elements with memory: memristors, memcapacitors and meminductors", vol. 97, No. 1717, Jan. 23, 2009, pp. 1-6.
Flak, J., "CNN Cell with Memcapacitive Synapses and Threshold Control Circuit", (2012), 5 pages.
International Technology Roadmap for Semiconductors, 2011 Edition, (2011), 110 pages.
Jo, S.H. et al., "High-Density Crossbar Arrays Based on a Si Memristive System", American Chemical Society, Nano Letters vol. 9, No. 2, Jan. 21, 2009, pp. 870-874.
Lai, Q. et al., "Analog memory capacitor based on field-configurable ion-doped polymers", Applied Physics Letters, vol. 95 (2009), pp. 213503-1-213503-3.
Martinez-Rincon et al., "Bistable non-volatile elastic membrane memcapacitor exhibiting chaotic behavior", vol. 58, No. 1809, Mar. 4, 2011, pp. 1-5.
Martinez-Rincon et al., "Solid-State Memcapacitive System with Negative and Diverging Capacitance", University of South Carolina, Department of Physics and Astronomy, Scholar Commons Faculty Publications, vol. 81, No. 19, May 25 2010, pp. 195430-1-195430-7.
Pershin, Y.V. et al., "Memory effects in complex materials and nanoscale systems", University of South Carolina, Department of Physics and Astronomy and USC Nanocenter, Advances in Physics, vol. 60, Nov. 12, 2011, pp. 1-59.
Simmons, J.G. "Generalized Formula for the Electric Tunnel Effect between Similar Electrodes Separated by a Thin Insulating Film", Journal of Applied Physics vol. 34, No. 6, (Jun. 1963), pp. 1793-1803.
Mineko, Mohri, "International Preliminary Report on Patentability", Patent Cooperation Treaty International Searching Authority, Sep. 8, 2015, 8 pages.
Thomas, Shane, "International Written Opinion and Search Report", Patent Cooperation Treaty International Searching Authority, Jul. 30, 2014, 10 pages.

\* cited by examiner

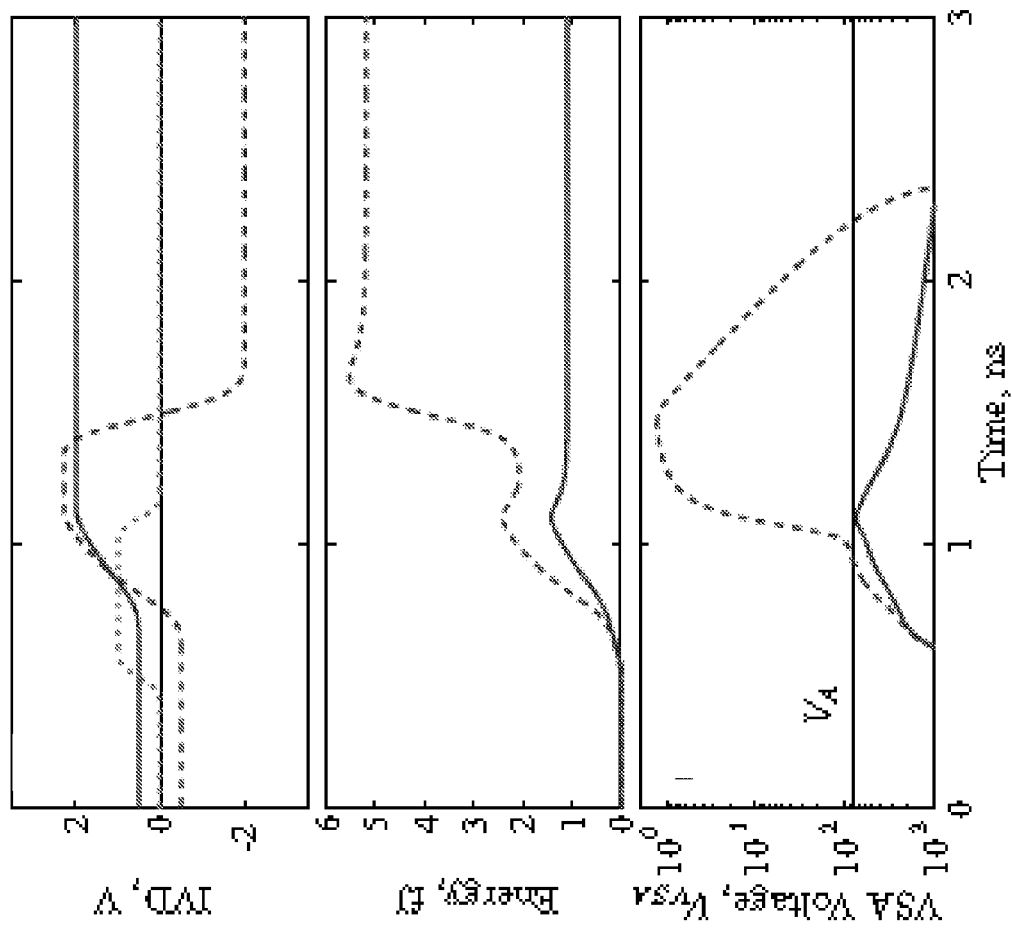

| A | B | W(0) | AB | AB̄ | ĀB | Ā+B̄ | A | B | AB+ĀB̄ |
|---|---|---|---|---|---|---|---|---|---|
| 1 | 1 | 0 | 1 | 0 | 0 | 0 | 1 | 1 | 1 |
| 1 | 0 | 0 | 0 | 1 | 0 | 0 | 1 | 0 | 0 |
| 0 | 1 | 0 | 0 | 0 | 1 | 0 | 0 | 1 | 0 |
| 0 | 0 | 0 | 0 | 0 | 0 | 1 | 0 | 0 | 1 |

| | A | A | B | AB | A,B̄ | A,B | A,B,1 | A | B | A,B |
|---|---|---|---|---|---|---|---|---|---|---|
| Registry | | | | | | | | | | |
| 1st operation | W(0) | ③ AB | ④ AB̄ | ④ ĀB | ② A+B̄ | | | ① A+B̄ | | ③ (A+B̄)(Ā+B) |
| 2nd operation | | | | | ④ Ā+B | | | | | |

| Registry | $A$ | $B$ | $C$ | $A$ |
|---|---|---|---|---|
| 1st operation | $AB$ ③ | $A+B$ ③ | ③ | ③ |
| 2nd operation | $ABAC = ABC$ ③ | $A+B$ ④ | $AC$ ③ | $A+C$ ④ |
| 3rd operation | $\overline{ABC}+\overline{ABC}$ ② | $\overline{(A+B)(A+C)} = \overline{ABC}$ ② | $AB+AC = A(B+C)$ | $\overline{(A+B)(A+C)} = \overline{ABC}$ ② |
| 4th operation | $\overline{ABC}+\overline{ABC}+\overline{ABC}$ ② | $\overline{ABC}\overline{ABC} = 0$ | $A(B+C)$ | $\overline{ABC}$ |
|  |  | $0$ | $A(B+C)$ | $(\overline{ABC}+\overline{ABC})\overline{ABC} = 0$ ② |

FIG. 8L

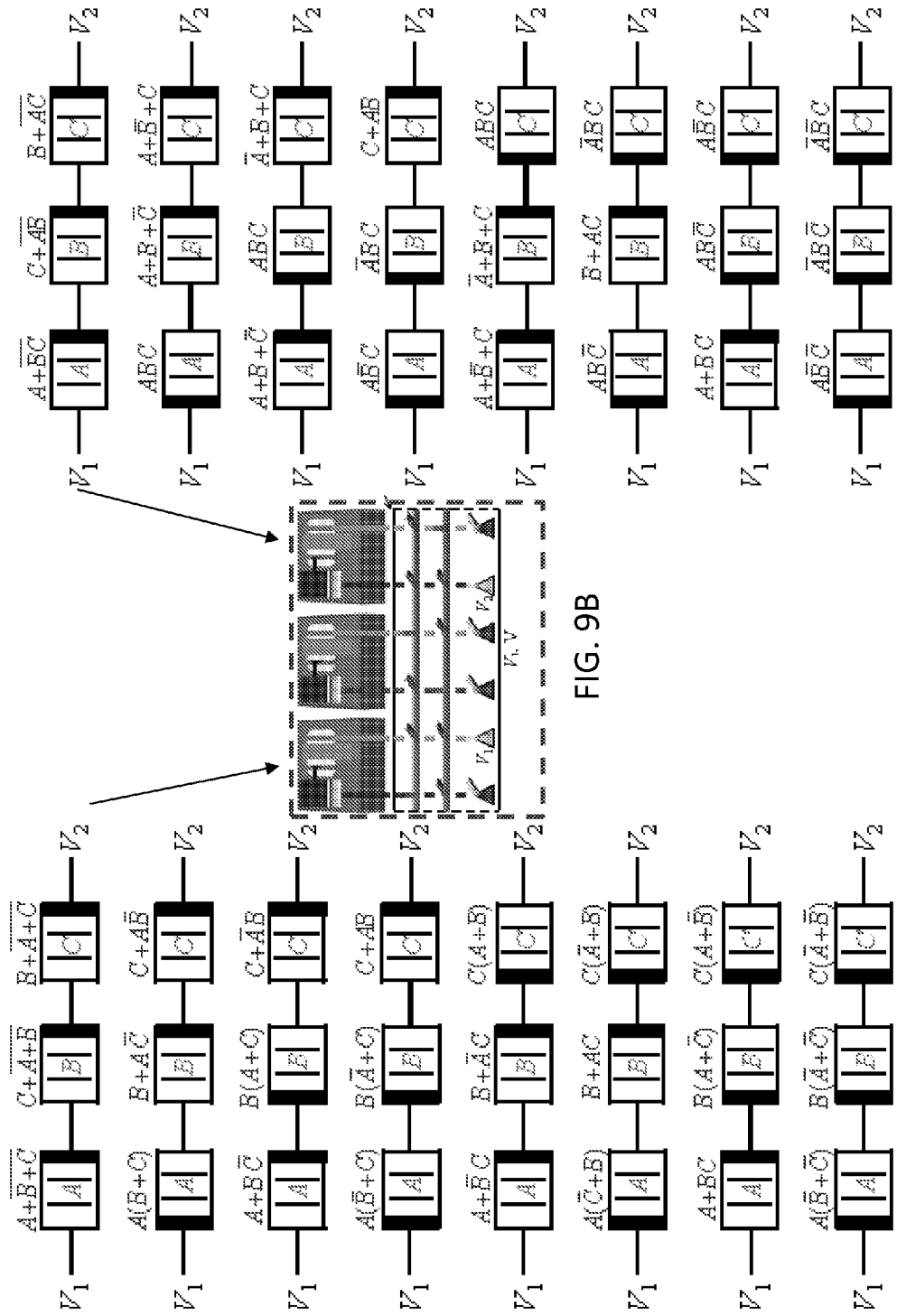

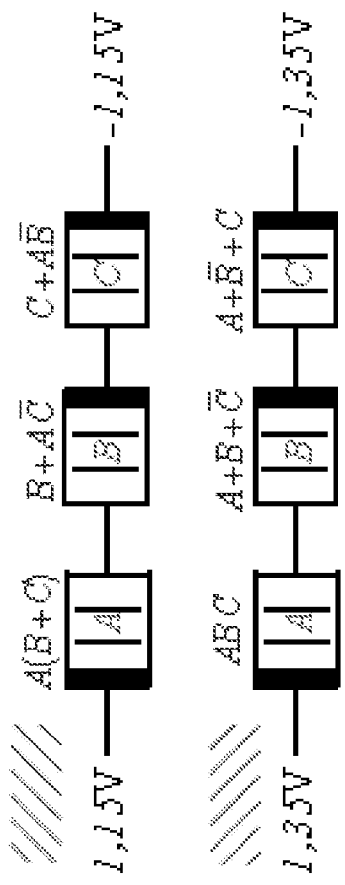
FIG. 9D
FIG. 9E
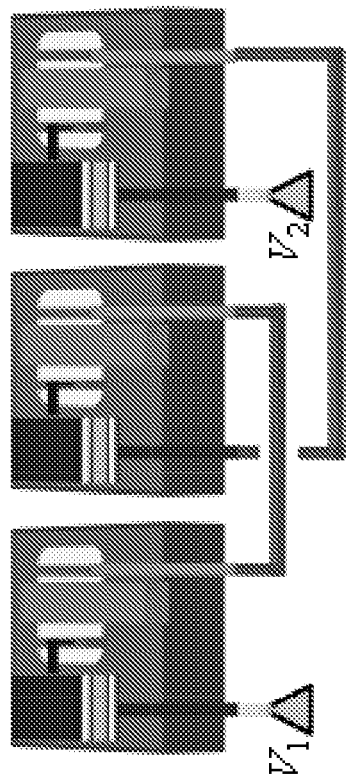
FIG. 9F

CIRCUIT FOR MIXED MEMORY STORAGE AND POLYMORPHIC LOGIC COMPUTING

PRIORITY CLAIM AND REFERENCE TO RELATED APPLICATION

The application claims priority under 35 U.S.C. §119 and from applicable treaties from prior provisional application Ser. No. 61/774,986, which was filed Mar. 8, 2013.

STATEMENT OF GOVERNMENT INTEREST

This invention was made with government support under DMR-802830 and ECCS-1202383 awarded by National Science Foundation. The government has certain rights in the invention.

FIELD

A field of the invention is VLSI circuits. The invention concerns mixed memory storage and polymorphic computing.

BACKGROUND

Most modern computing systems follow the so-called Von Neumann architecture. This architecture separates memory, control and logic. This widely successful model includes inherent performance limits that researchers have recently sought to overcome. Quantum computing represents one branch of research that seeks to provide massive parallelism in departure from the traditional model. Practical quantum computing systems still have many technological hurdles to overcome, and large scale quantum computing schemes have not yet been demonstrated to outperform traditional CMOS large scale integrations.

Memristors have been attracted a lot of attention due to the prospects of non-volatile information storage. See, Chua, L. O. & Kang, S. M., "Memristive devices and systems. Proc. IEEE 64, 209-223 (1976); the International Technology Roadmap for Semiconductors, 2011 Edition (http://www.itrs.net/). Memristors have been recently proposed to enable "stateful" logic operations via material implication. See, J. Borghetti et. al., "'Memristive switches enable 'stateful' logic operations via material implication," Nature, 464, 873, (2010). Memristive based systems employ intrinsically dissipative memristive devices, which consume power at a very high level.

Recent efforts, including research by some of the present inventors and colleagues, have provided information storage based upon capacitors or inductors with memory (together with memristors collectively called memelements). See, Di Ventra, M., Pershin, Y. V. & Chua, L. O., "Circuit elements with memory: memristors, memcapacitive systems and meminductors," Proceedings of the IEEE 97, 1717-24 (2009). Computation has been demonstrated only with memristors (but not memcapacitors or meminductors) as stated in the previous paragraph where J. Borghetti et. al. has been cited. The computation demonstrate with the memristors was limited only to the logic operation "IMP" (material implication).

Some of memelements are readily fabricated with current technology and can be integrated with CMOS. Pershin, Y. V. & Di Ventra, M., "Memory effects in complex materials and nanoscale systems," Advances in Physics 60, 145-227 (2011); Jo, S. H., Kim, K-H. & Lu, W., "High-Density Crossbar Arrays Based on a Si Memristive System,". Nano Lett. 9, 870874 (2009). These past efforts focused mainly on models and realizations of memcapacitors and meminductors but fail to provide any basis for computing (including binary logic operations) based on these elements.

SUMMARY OF THE INVENTION

An embodiment of the invention is circuit for mixed memory storage and polymorphic computing. The circuit includes a plurality of memory cells each selectively or fixedly connected to a word line, bit line and dual bit line. Each memory cell includes a memcapacitive element. Voltage pulse generators can selectively applying voltage pulses to the memory cells. Preferred embodiments also include sense amplifiers for reading and refreshing contents of the memory cells. Control circuitry is applied to control the voltage generators and sense amplifiers to conduct logic operations using two or more of the memory cells.

A method for mixed memory storage and polymorphic computing in at least two memory cells each having a memcapacitive element is provided. Data is stored by selectively applying voltage pulses to an individual memory cell to set an internal charge level of the memcapacitive element. Logic functions are conducted by applying voltage pulses having independent amplitudes to at least two memory cells to achieve internal charges in the memcapacitive elements of the cells to store an output bit according to a logic map that depends upon applied independent voltage pulse amplitudes.

BRIEF DESCRIPTION OF THE DRAWINGS

FIGS. 7B-7E illustrate READ/REFRESH for the DCRAM using a pulse generator and a voltage sense amplifier;

FIGS. 8I and 8J illustrate possible two-bit logic operations for the DCRAM cells that are illustrated in FIGS. 8B/8C;

FIGS. 9A-9C illustrate three cell logic operations with reference to the DCRAM of FIGS. 1 and 6;

FIGS. 9D-9F illustrate a two-level operations in which cell connections are fixed, and not switched, and logic is accomplished with varying pulse amplitudes; and FIGS. 9G-9H illustrate a three-level operation in which cell connections are fixed, and not switched, and logic is accomplished with varying pulse amplitudes with the polymorphic gate of FIG. 9E having two different outputs depending upon applied potential.

DESCRIPTION OF THE PREFERRED EMBODIMENTS

Figures 1, 2, 3:
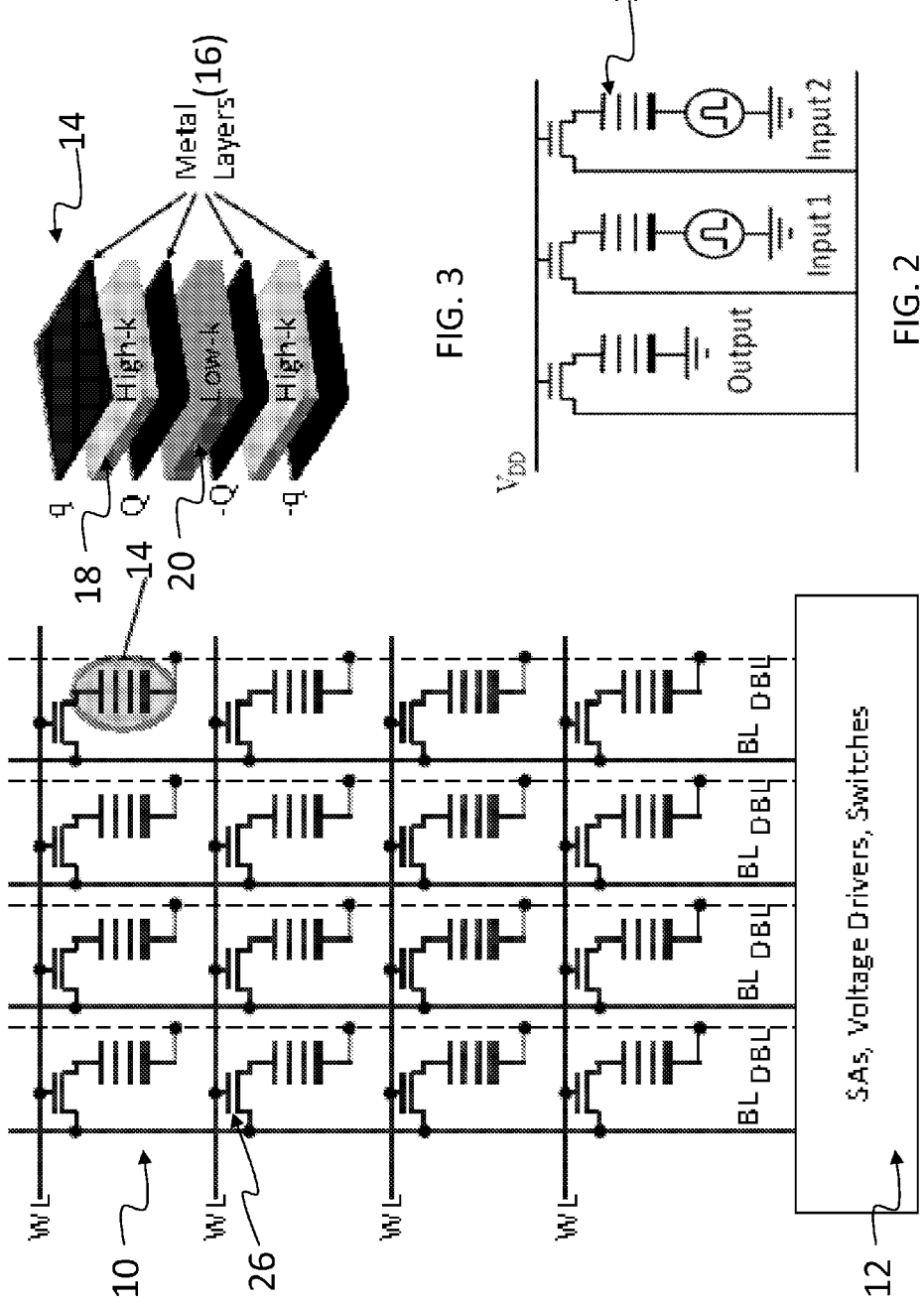
FIG. 1 is a schematic diagram of a preferred embodiment dynamic computing random access memory of the invention.
FIG. 2 is a schematic diagram of three cells from the dynamic computing random access memory (DCRAM) of FIG. 1.
FIG. 3 is a schematic diagram in cross-section of a memcapacitor that can be used in the DCRAM of FIG. 1.

Particular embodiments of the invention provide solid state memcapacitor circuits and memcomputing systems that can provide computation with memory elements, to achieve computation and storage of information on the same platform. Preferred embodiments of the invention provide memcapacitor based VLSI circuits that store data and perform computation at the same time. Advantageously memelement circuits of the invention provide additional miniaturization by combining logic and memory.

Previous work discussed in the background demonstrate the use of memristors for memory operations. The invention greatly expands this area by using memcapacitors to conduct computation and storage operations at the same time and to generalize computation operations. Preferred embodiments use memcapacitors to compute and store at the same time. Memcapacitors store energy and can be integrated with VLSI, permitting the latter to be reused during computation to provide a low-energy form of computation.

Other embodiments use different types of memcapacitor cells. For example, bistable membrane memcapacitive systems (see J. Martinez-Rincon and Y. V. Pershin, Bistable non-volatile elastic membrane memcapacitor exhibiting chaotic behavior, IEEE Transactions on Electron Devices 58, 1809 (2011)) and polymer-based memcapacitive systems (see Q. Lai, L. Zhang, Z. Li, W. F. Stickle, R. S. Williams, and Y. Chen, "Analog memory capacitor based on field-configurable ion-doped polymers", Appl. Phys. Lett. 95 (2009), p. 213503) are alternatives. Ferroelectric capacitors and ferroelectric ram are other possible alternatives.

Preferred embodiments of the invention provide circuits of interacting memcapacitors capable of storing data and performing logic functions, such as AND, OR, etc at a very low energy cost. Circuits of preferred embodiments of the invention can be implemented in Very Large Scale Integrated (VLSI) circuits, allowing for large scale low-cost production, very low power consumption and mixed mode operation for memory storage and polymorphic logic computing on the same physical platform.

Other embodiments of the invention realize analog-type computation utilizing circuits (networks) of memcapacitors. Such circuits could perform different tasks including analog addition and multiplication, solution of graph theory optimization problems and brain-like computing. In the core of all these applications is the ability of memcapacitors to store and process information on the same physical platform.

A preferred embodiment system utilizes low power dissipation memcapacitive devices to provide a DCRAM (Dynamic Computing Random Access Memory). A DCRAM of the invention can provide massively-parallel logic operations directly in memory thus offering a practical solution to the von Neumann bottleneck.

Preferred embodiment DCRAM can resolve the intrinsic limitations of prior state of the art architectures by enabling computing and storing of information on the same physical platform. DCRAM of the invention can provide massively-parallel and polymorphic digital logic. Different logic operations can be achieved in the invention with the same architecture, by varying only control signals. Alternatively, switching can be added to alter connections between cells. With either control signal variation or connection switching, a hardware cell of the invention can provide multiple logic functions traditional performed by different hardware cells in traditional VLSI circuitry. Analysis shows that energy expenditures of preferred DCRAM can be as low as a few femtojoules per operation. DCRAM of the invention are fully compatible with present CMOS technology and can be integrated therewith. Fabrication can be achieved with current fabrication systems.

An embodiment of the invention is circuit for mixed memory storage and polymorphic computing. The circuit includes a plurality of memory cells each selectively or fixedly connected to a word line, bit line and dual bit line. Each memory cell includes a memcapacitive element. Voltage pulse generators can selectively applying voltage pulses to the memory cells. Preferred embodiments also include sense amplifiers for reading and refreshing contents of the memory cells. Control circuitry is applied to control the voltage generators and sense amplifiers to conduct logic operations using two or more of the memory cells.

A method for mixed memory storage and polymorphic computing in at least two memory cells each having a memcapacitive element is provided. Data is stored by selectively applying voltage pulses to an individual memory cell to set an internal charge level of the memcapacitive element. Logic functions are conducted by applying voltage pulses having independent amplitudes to at least two memory cells to achieve internal charges in the memcapacitive elements of the cells to store an output bit according to a logic map that depends upon applied independent voltage pulse amplitudes.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

FIGS. 1-3 illustrate a 16 bit memory cluster and DCRAM in accordance with a preferred embodiment that is illustrated with memcapacitors. A plurality of cells 10 form the example memory, and connections with sense amplifiers, voltage drivers and switching logic 12 complete the DCRAM. FIG. 3 shows the structure of a preferred example memcapacitor 14 that forms part of each cell 10, and FIG. 2 three cells 10 configured during an operation. Connection is via a standard FET to the word line WL and the bit line BL. Artisans will appreciate that preferred embodiments, such as the FIG. 1 memory cluster can be implemented in VLSI using similar technological solutions for standard DRAMs that allow for large scale low-cost production, very low power consumption and mixed mode operation for memory storage and polymorphic logic computing on the same physical platform.

In FIG. 1, WL is a word line and BL is a bit Line. DBL is a dual bit line. The write, read and refresh processes can be performed in a similar way as for DRAMs using a configuration composed of word line (WL) and double bit line (bit line (BL) and dual bit line (DBL). It is also possible to make computation directly inside the platform. It can be reached simply by working with two, three or more memory cells with a common WL as illustrated in FIG. 2. FIG. 2 shows the configuration of three memory cells. In this configuration, the BLs of three cells have the SAs temporarily disconnected by switching in the control logic circuitry 12 and they are connected together to a floating common line (not illustrated but part of logic circuitry 12). The control logic circuitry 12 also includes control in the form of hardware or firmware to execute various logic and storage operations as will be discussed. The output (one of the three cells) memcapacitor is initially set to a certain state and voltage pulses with different amplitudes are successively applied at the DBLs. $V_{DD}$ is applied to to WL across the cells to the DBL. The global current response of the three memory cells will depend on the internal states of the memcapacitors.

The FIG. 1 operation can also provide a variety of additional circuit operations other than the cell operation in FIG. 2. For example, the same memcapacitor could be used to store Input and Output values. In this case, the circuit from FIG. 2 reduces to a circuit of two memcapacitors coupled to a traditional capacitor.

FIG. 3 illustrates the structure of a preferred example memcapacitor 14. The memcapacitor shown in FIG. 3 is based upon prior work of two of the present inventors and a colleague. See, J. Martinez-Rincon, M. Di Ventra, Y. V. Pershin, Solid-state memcapacitive system with negative and diverging capacitance, Phys. Rev. B 81, 195430 (2010). The structure is composed of a plurality of metal layers 16 embedded with two high-K 18 and one center low-K 20 between the metal layers 16. Electron transfer between external plates of the capacitor with charge ±q and internal metal layers with charges ±Q can be assumed negligible. Therefore, the internal charges Q can only be redistributed between the internal layers creating a medium polarization. Depending on where the charge Q is distributed (top or bottom layer), the state of the memcapacitor is assumed 1 (top) or 0 (bottom). These structures can be fabricated with current technologies, e.g., molecular beam epitaxy (MBE). While three layers are illustrated, more layers can be used. The most external insulating layers are preferably made of high-K materials 18 with very high potential barrier so that negligible charge can pass through them. The intermediate layer 20 is formed out of a low-k material with a low potential barrier. This choice allows for non negligible charge migration between two internal metal layers at appropriate bias conditions. If the middle insulator layer is thin enough, the internal charge current is due to quantum tunneling and can be easily tuned over a wide range of values. See, Simmons, J. G., "Generalized Formula for the Electric Tunnel Effect between Similar Electrodes Separated by a Thin Insulating Film.," J. Appl. Phys. 34, 1793 (1963).

The write process is the usual write process for DRAMs, i.e., to store data, a row is opened and a given column's sense amplifier (SA) is temporarily forced to the desired high (positive) or low (negative) voltage state. In this case, the positive (negative) applied voltage over (under) a certain threshold moves the charge Q form the bottom (top) to the top (bottom) layer. Providing that the potential barrier due to the semiconductor between the layers is high enough (our simulation shows that 0.4 eV is a reasonable barrier height), the charge Q persists practically indefinitely on the desired layer avoiding the periodic refresh of the cell typical for the DRAMs.

Figure 4:
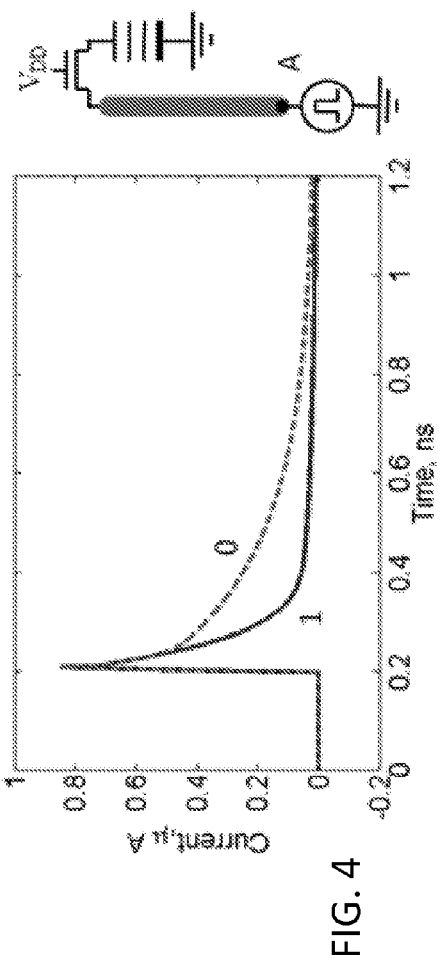
FIG. 4 illustrates simulated current response at a terminal for the two different states of the memcapacitor of FIG. 3.

The read process is quite different from the DRAMs. In fact, the charge Q cannot flow out of the memcapacitor, but it can only move from one layer to the other. However, while the charge Q is moving, the dynamic capacitance of the memcapacitor dramatically varies depending on the applied voltage. This induces a current response to a voltage pulse to the terminal of the sense amplifier that is different depending on where the charge Q is distributed. FIG. 4 shows the current response (simulated current response) at terminal A for the two different states of the memcapacitor, where the connection between the voltage pulse generator and the memcapacitor is modeled, as usual, as a transmission line. The difference in the current response can be used to read the data. As in the case of DRAM, reading is a destructive process, so a proper sense amplifier is used to refresh the bit that has been read.

Computation is performed directly inside the memory with two or more memory cells, as in the example shown with three memory cells with common word line in FIG. 3. In FIG. 2, with the BLs of three cells having SAs temporarily disconnected and being connected to a floating common line, the output memcapacitor is initially set to 1 and voltage pulses with different amplitudes are successively applied at the DBLs by voltage drivers in the circuitry 12. The global current response of the three memory cells 10 will depend on the internal states of the memcapacitors 14.

Figure 5:
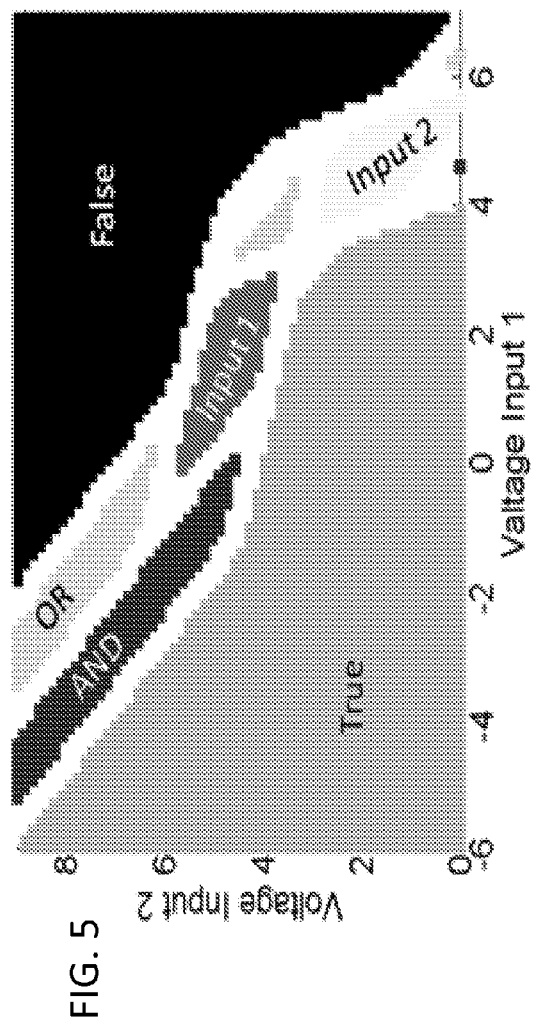
FIG. 5 illustrates output states of the memcapacitor of FIG. 3 defined by the invention to provide logic necessary for computation in addition to storage.

FIG. 5 maps final states of the output memcapacitor based upon inputs measured in volts, which provides logic necessary for computation. The plane V1-V2 is clearly divided in several regions, each representing the final state of the output memcapacitor depending on the original states of the input cells. It is remarkable that, neglecting the dissipated power due to the loss in the BL lines, the dissipated power of the computation depends just on the charge switching inside the memcapacitors. Only a portion of the input is therefore dissipated and a proper design of these devices (small semiconductor thickness, small barrier height, optimization of the dielectric constants, etc.) can allow realization of very low power consumption.

Embodiments of the invention can also use, for example, membrane memcapacitor circuits. See, J. Martinez-Rincon and Y. V. Pershin, "Bistable non-volatile elastic membrane memcapacitor exhibiting chaotic behavior," IEEE Transactions on Electron Devices 58, 1809 (2011). Preferred embodiments are based upon solid state memcapacitors. See, Martinez-Rincon, J., Di Ventra, M. & Pershin, Y. V., "Solid-state memcapacitive system with negative and diverging capacitance," Phys. Rev. B 81, 195430 (2010).

Figure 6:
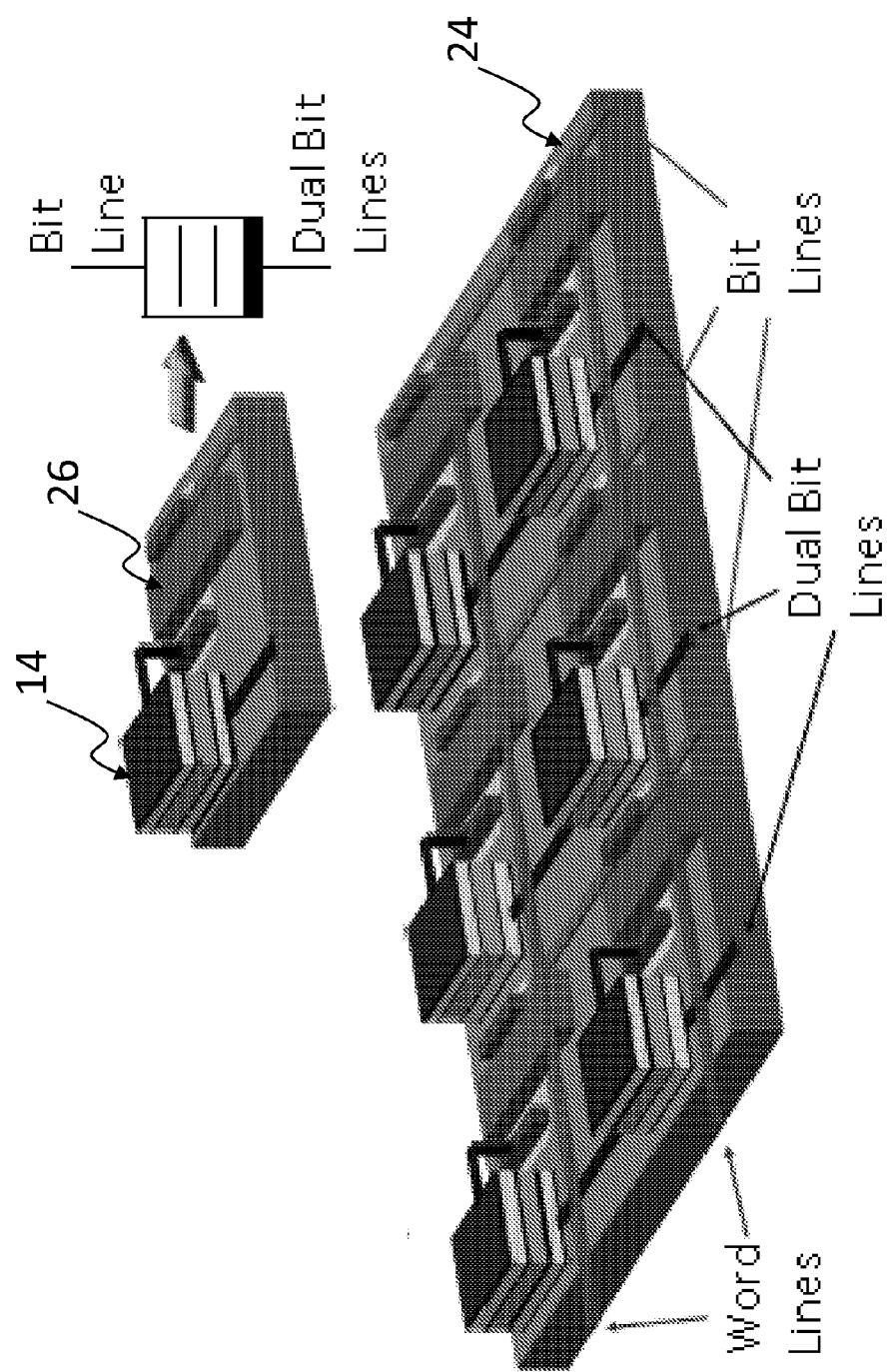
FIG. 6 schematically illustrates in perspective form a fabrication of a dynamic computing random access memory in accordance with the preferred embodiment of FIG. 1.

FIG. 6 illustrates a preferred embodiment DCRAM that uses memory cells based upon solid state memcapacitors and is consistent with FIG. 1 and fabricated on a common substrate 24. The two-dimensional DCRAM circuit has an array of cells having an access element (MOSFET) 26 with a gate controlled by the word line. In order to perform READ or WRITE operations with a given cell, a positive voltage is applied to its word line, ground to its dual bit line, and suitable voltage pulses to its bit line. For computation purposes, several cells can be coupled through bit and dual bit lines.

Figure 7A:
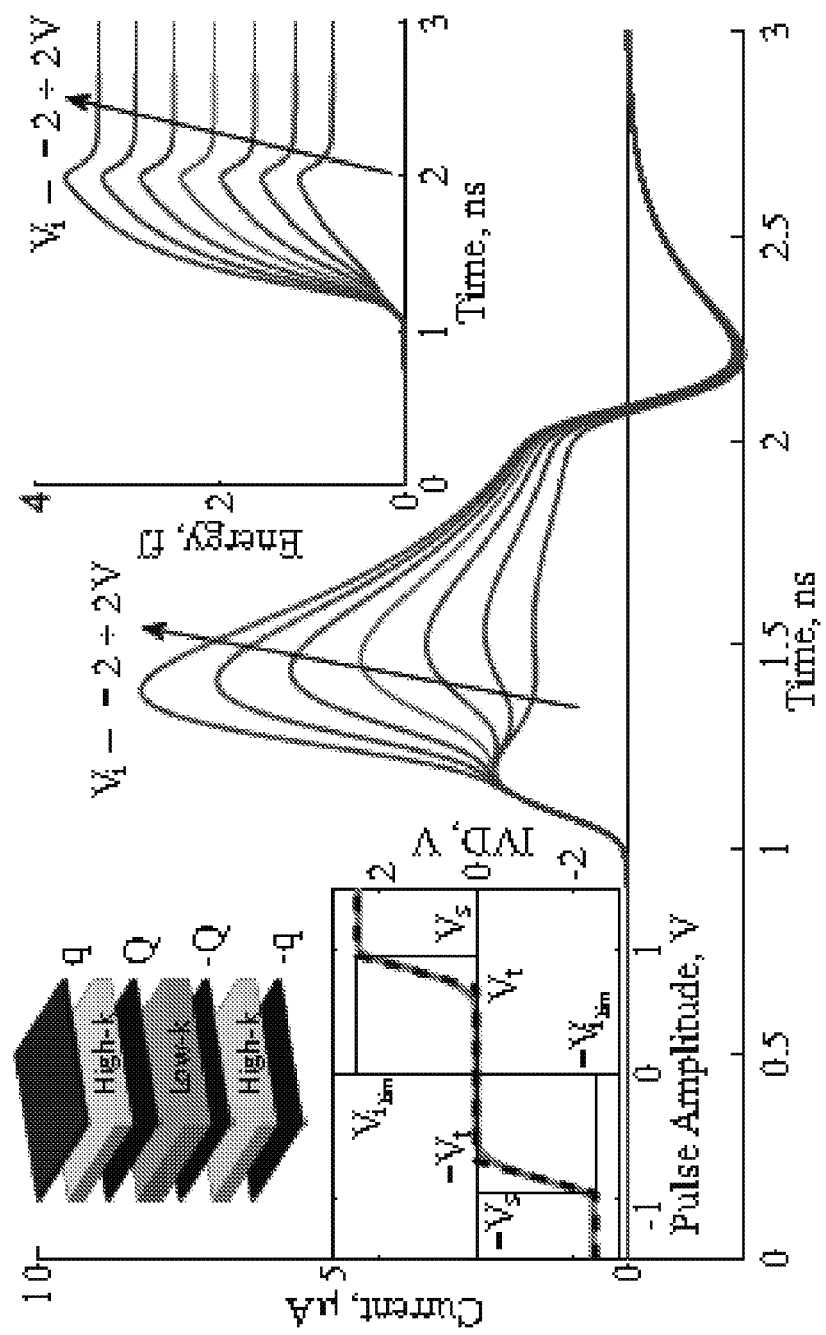
FIG. 7A shows single cell response (same simulated current response as FIG. 4 but with different fabrication parameters—close to the ITRS parameters for DRAMs) to a voltage pulse under READ/WRITE for the DCRAM of FIGS. 1 & 6.

The DCRAM of FIG. 6 has topology that permits information storage and logic operations using memory cells that are solid-state memcapacitive systems. FIG. 7A shows single cell response to a voltage pulse under READ/WRITE for the DCRAM of FIG. 6. In simulations, the bit and dual bit lines were modeled as transmission lines with typical parameters for DRAM R=1.5 kmm$^{-1}$ and C=0:2 pFmm$^{-1}$ assuming 1 mm line length. The voltage pulse is a smooth square pulse of 1 V amplitude and 1 ns width starting at t=1 ns. The main graph is the current response measured at the end of the bit line for several initial values of the internal charge Q. The middle line refers to Q=0 initial condition. To quantify Q, an effective internal voltage difference (IVD) is denied as $V_i$=Q/$C_2$ with $C_2$ being the geometrical capacitance of the intermediate layer. $C_2$=A∈$_0$k$_{low-k}$/d$_{low-k}$, where A is the surface area, ∈0 is the vacuum permittivity, k$_{low-k}$ is the relative permittivity of the central layer, and d$_{low-k}$ is its thickness. The top right inset shows the cell's dissipated energy. The bottom left inset shows the effective internal voltage difference as a function of voltage pulse amplitude in 1 s after the voltage pulse application.

The capacitance $C_d$ of a solid-state memcapacitive system is derived using the standard relation q=$C_d$V, where q is the charge on the capacitor plates (external metal layers) and V is the applied voltage. Importantly, $C_d$ is a function of the internal state, namely, it depends on the ratio Q=q where Q is the internal charge (top left inset FIG. 7A). $C_d$ can diverge and take negative values, leading to a variety of transient responses (FIG. 7A). The internal memory of the memcapacitive system arises from the delay of the internal charge response caused by a tunneling barrier of the central insulator layer. The tunneling barrier can be lowered by a voltage bias applied to the capacitor plates. In this case, a finite internal current (between the internal metal layers) changing Q is possible. The internal charge Q becomes trapped when the shape of the potential barrier is restored. Therefore, the applied voltage pulses can be used to control the internal charge Q, which can be subsequently stored. The lifetime of Q can be set within wide ranges depending on geometrical and physical properties of the structure.

Read and Write Operations

Binary information is encoded in the internal charge Q of the memcapacitive system of FIG. 6. Q≥$Q_r$ corresponds to logic 1. Q≤−$Q_r$ corresponds to logic 0, and the logic value is not defined when −$Q_r$≤Q≤$Q_r$. The threshold $Q_r$ is introduced to reliably distinguish logic values, and as such is defined according to the sensitivity of the voltage sense amplifiers. Voltage sense amplifiers are well understood as they are applied in conventional DRAM memories for read and refresh operations.

The WRITE, READ and logic operations with memcapacitive memory cells are performed with the help the control circuitry 12 that provides appropriate signals. Consider the WRITE operation first. The dual bit line (DBL) is grounded and the voltage pulse is applied to the bit line (BL). The applied voltage pulse lowers the potential barrier between the internal metal layers allowing for an internal charge redistribution. The WRITE process is based upon a threshold voltage $V_t$ such that there is no significant charge transfer between the internal plates at applied voltage amplitudes below $V_t$. This is illustrated in the bottom left inset in FIG. 7A. When pulse amplitudes exceed $V_t$ a considerable amount of charge can tunnel between the internal layers. In an example structure, $V_t$ is about 0.5V, which is large enough to avoid being affected by typical perturbations induced by metal-oxide semiconductor (MOS) transistor leakage currents. The existence of $V_t$ also provides a charge saturation, as seen in the bottom left inset of FIG. 7A.

The READ operation is destructive and therefore is followed by a REFRESH, in the case of the memcapacitors of the preferred embodiment that is illustrated. Other types of memcapacitors with multistable states provide a non destructive READ operation (e.g., membrane memcapacitors). With such memcapacitors, a READ would not require REFRESH operations.

The current response of FIG. 7A reveals variations in the cell response that depend on the initial value of Q. The sense amplifiers in the circuitry 12 can read a stored logic value based upon these differences. To meet the VSA modus operandi, current response can be transformed into a voltage response connecting the bit and dual bit lines to the VSA input terminals. The voltage pulse in the READ operation changes the internal charge A, and therefore a REFERESH is applied after READ. The top right inset in FIG. 7A shows the dissipated energy when a pulse that is 1 ns long and 1V is applied, which can be used for all operations, WRITE, READ, COMPUTE because of similar operating conditions. Energy is only on the order of a few femtojoules, which is comparable with state of the art CMOS storage. However, because information is stored directly in the DCRAM, power is saved by avoiding a transfer operation to and from a CPU.

As discussed above, when a voltage pulse is applied to a memory cell, its current response strongly depends on its internal charge Q. This can be used to read the information stored in the memory cell. The common solution (used in standard DRAM technology) employs voltage sense amplifiers (VSAs). This solution can be adapted to the READ operation for the DCRAM of the invention. VSAs are connected to the memory cell in series with a voltage pulse generator, as illustrated in FIGS. 4 and 7F-7H. The ideal characteristics of the VSA are presented in FIG. 7B for different operations, showing the two cases were its input signal is below (lower line) and above (upper line) its threshold. It is important to know that VSA amplifies the response voltage $V_{VSA}$ if $V_{VSA}$>$V_A$, where $V_A$ is a predetermined threshold voltage. Generally, the delayed response of VSAs is associated with internal capacitances of MOS structures. During the delay time, the voltage pulse generator induces the response voltage $V_{VSA}$. Being amplified, $V_{VSA}$ provides the value stored in the memory cell.

As shown in the FIG. 7C, when the voltage pulse acts, the information inside the memory cell is destroyed since the final state inside the memory cell is 1. The dotted line in FIG. 7C is the pulse by the generator, while the solid line is the case of bit 1 partially written and subsequently refreshed, and the dashed line is the case of bit 0 partially written and subsequently refreshed. Therefore, similarly to common DRAMs, the reading process is destructive and thus needs to be coupled with a subsequent REFRESH process. The sequence thus consists of two steps. First, a voltage pulse (in our simulations, of 0.5 ns length and 1 V amplitude) is applied by the generator. It produces a voltage response that is considered as input for VSA during its "delay state". Subsequently, if $V_{VSA}$>$V_A$ the VSA amplifies the voltage $V_{VSA}$ and 0 is written, on the contrary, if $V_{VSA}$<$V_A$ then the VSA does not act and 1 is written. This is illustrated in FIGS. 7D and 7E, which illustrate an extreme simulation case with a partially decayed bit. FIGS. 7C-7D respectively show the time variation of the normalized charges Q/$C_2$ (solid and dashed outer lines) and the voltage pulse (inner dotted line), the dissipated energy, and VSA voltage output.

Figure 7B:
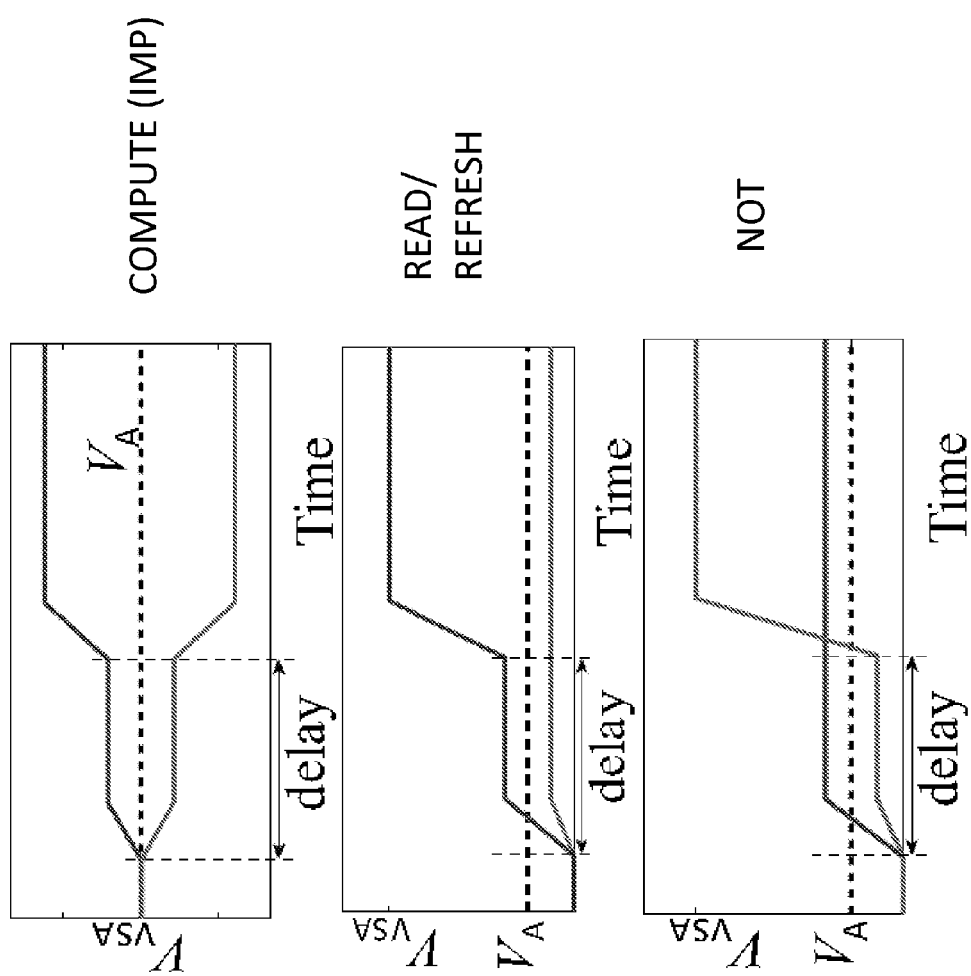
Figures 7F, 7G, 7H:
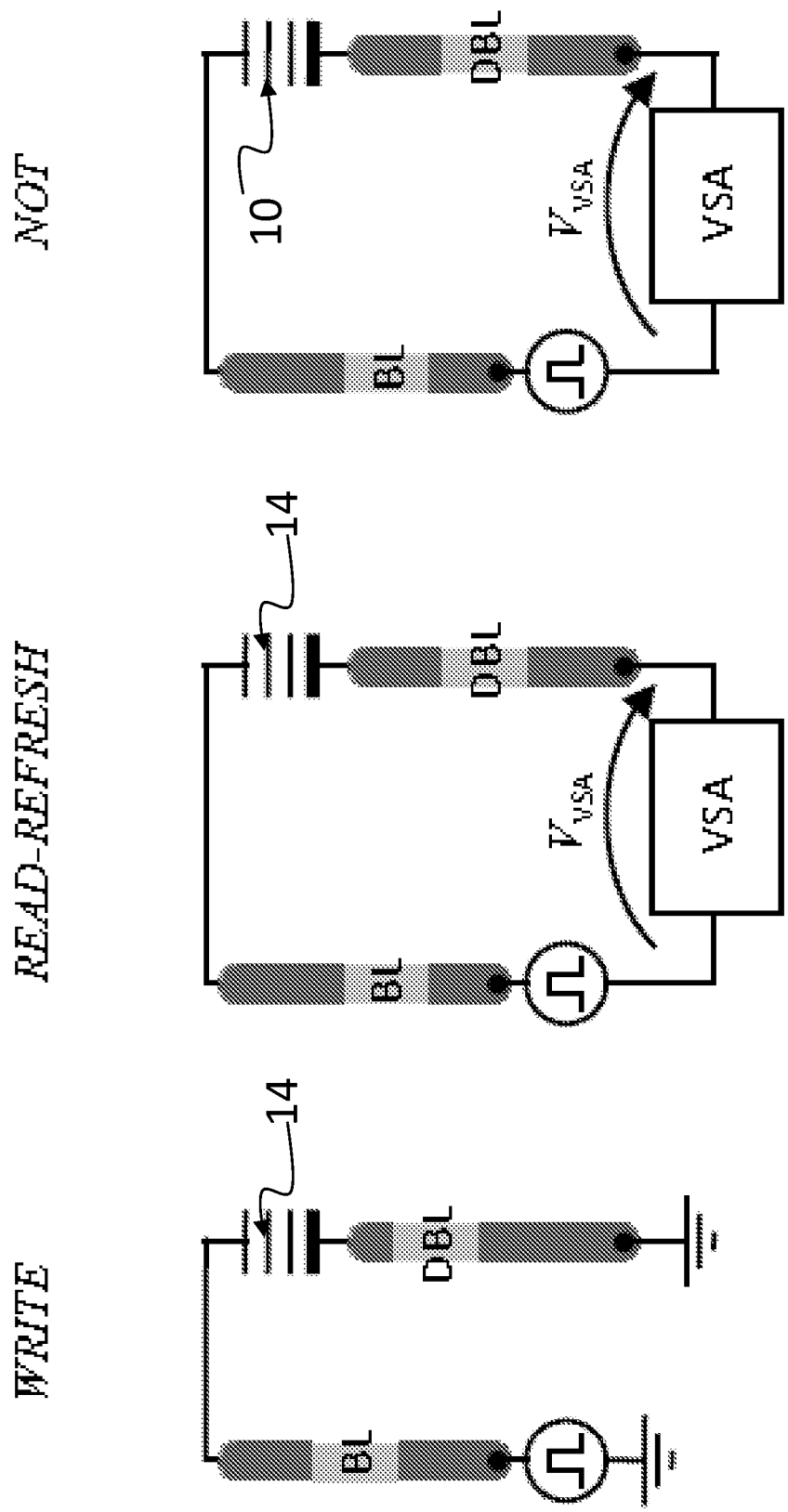
FIGS. 7F-7H illustrate cell configurations for WRITE, READ-REFRESH, and NOT.

FIGS. 7F-7H illustrate cell configurations for WRITE, READ-REFRESH, and NOT. To implement the NOT operation, the applied pulse is synchronized with the VSA delay. The ideal characteristics are shown in FIG. 7B.

Polymorphic Compute Operation

For COMPUTE, memory cells are coupled and logic operations are realized. Polymorphic logic gates can be obtained using switches at the end of the BL and DBL to create appropriate connections of two (or more) memory cells. A boolean function of choice can be applied to a pair of input memcapacitive cells and its result can be written into a different third cell. A couple of synchronized voltage pulses applied to these cells induce a dynamical process such that the values of internal charges Q hold the result of logic gates applied to the initial values.

Figures 8A, 8B, 8C:
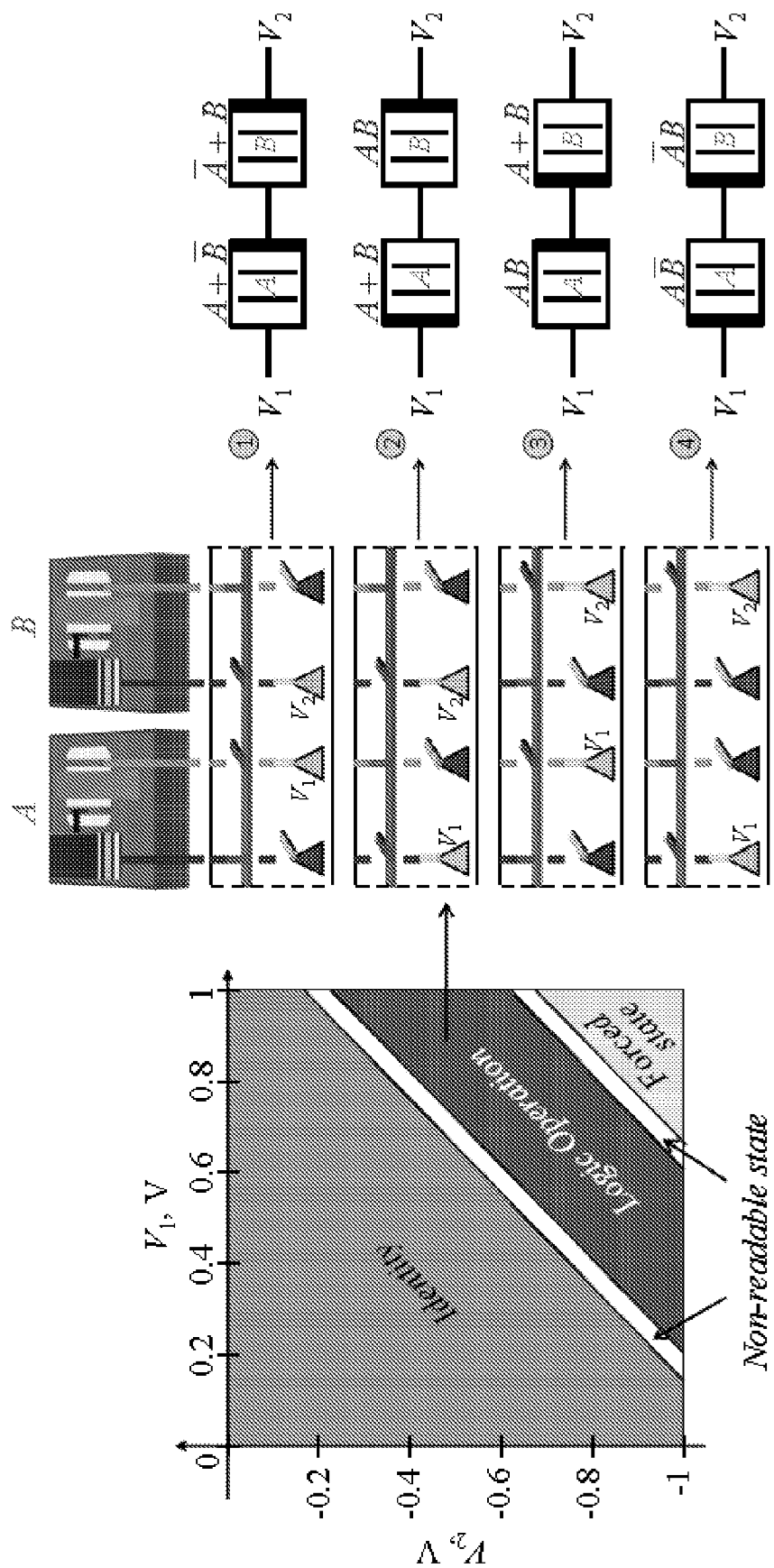
FIGS. 8A-8C illustrate two cell logic operations with reference to the DCRAM of FIGS. 1 and 6.

FIGS. 8A-8C illustrate logic operations via switching of connections between two cells. WL is not shown but it is assumed to be connected to both FETs and to be charged so the FETs are both working. Moreover, in FIG. 8B, the BLs and DBLs are connected together or to a voltage generator represented by the triangles. For example, the first configuration has the DBL1 connected with the BL2 and the BL1 connected to the voltage generator V1 and the DBL2 connected to the voltage generator V2. Two memory cells can be connected in four different ways giving rise to four logical operations. The symbols + and − are the OR and NOT operation respectively, while the AND operation is the implicit multiplication. $V_1$ and $V_2$ are amplitudes of voltage pulses applied to the external connections of the coupled memory cells. Depending on these amplitudes, there are several regions in the logic map of FIG. 8A. Amplitudes belonging to the identity region do not change initial values in memory cells. Amplitudes belonging to the logic operation region perform computation in accordance with FIG. 8C. Amplitudes belonging to the forced state region change the initial values to 1 or 0 depending on device coupling order and polarity. Amplitudes belonging to the non-readable state region produce an intermediate (non readable) internal states with $-Q_r \leq Q \leq Q_r$.

The dynamics of the internal charges Q of two coupled cells subjected to a couple of synchronized voltage pulses depends on the initial combination of internal charges of these cells. In this way, the final values of the internal charges can be considered as a result of a logic operation over initial values stored at t=0 in these cells. A complete set of logic operations is provided with only AND and NOT or OR and NOT functions, which permit any logical expression to be evaluated. Two memory cells can provide 6 different operations, depending upon how the cells are coupled and the amplitudes of applied voltages. Thus, two coupled memory cells act as universal logic gates. In contrast, in standard CMOS several transistors are required to perform the same computations. As an example, a NAND gate in CMOS requires at least four transistors in a simple configuration.

The DCRAM circuit of the invention is also intrinsically capable of parallel computation. After one operation, there can be a different output on each memcapacitor cell, indicating the performance of two operations in a single step. Connection of more than two memory cells permits more complex operations in a single step, and there different outputs can be written into each memory cell. It is possible to perform simultaneous operations of multiple groups of two or three coupled cells. The voltage pulse amplitudes for READ, WRITE and logic operations are in the same range. This provides a memcomputing architecture that processes and stores information on the same physical platform using two-terminal passive devices. Low power, polymorphic and massive parallel capability are provided.

Figure 8D:
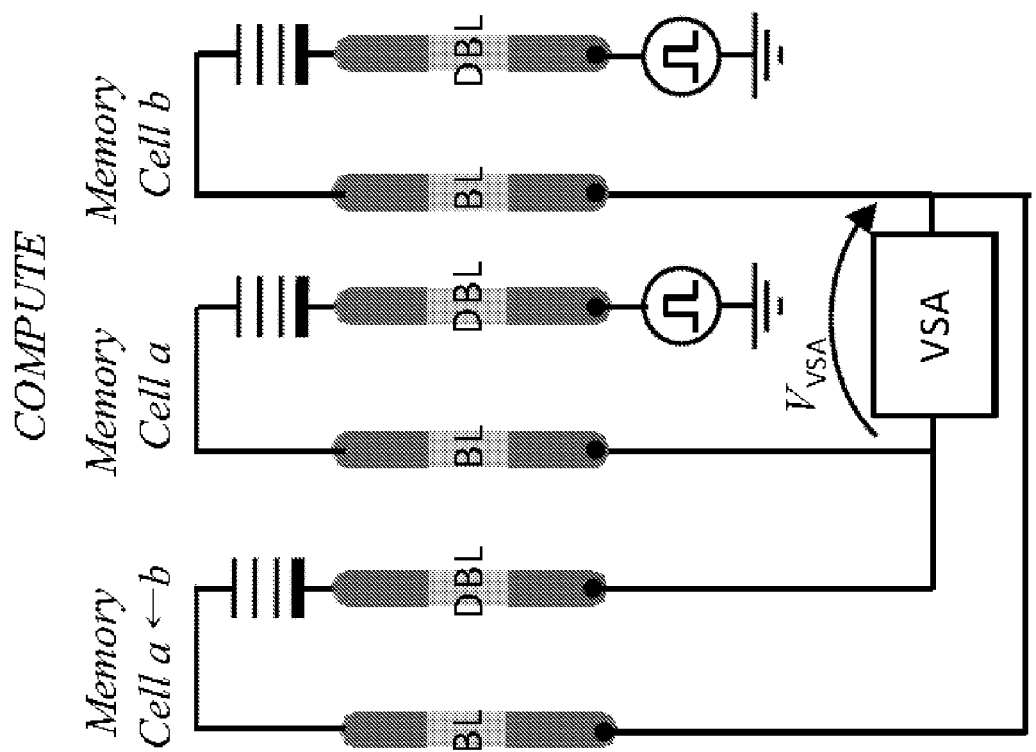
FIG. 8D shows a memory cell connection arrangement for logic function that is the material implication (IMP)

FIG. 8D shows the memory cell connection arrangement for the logic functions for the material implication function IMP. Computation is performed by applying synchronized voltage pulses to the cells involved in the computation. For low pulse amplitudes the data inside the cells are not degraded, and if two slightly different amplitudes are exploited the output of the VSA can be used to write the result of the logic operation into the third cell.

Figures 8E, 8F, 8G, 8H:
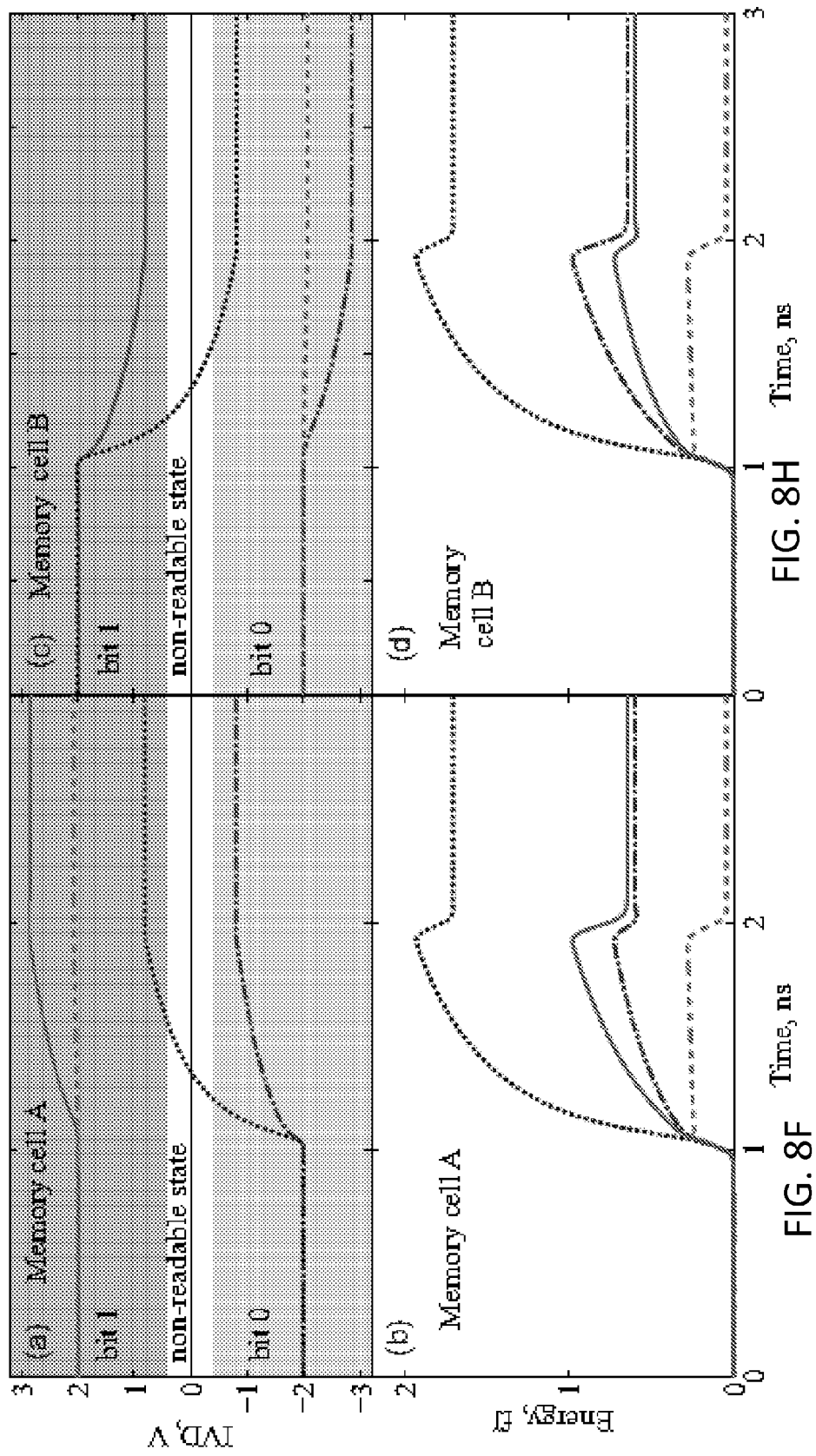
FIGS. 8E-8G illustrate example voltages for an operation when two when 2 memory cells are used to store the input and (after the computation) the output values in the second configuration of FIG. 8B/8C.

FIGS. 8E-8H illustrate example voltages for an operation when two when 2 memory cells are used to store the input and (after the computation) the output values. The figures show time variation of IVD and dissipated energy. For computation purposes, these memory cells are coupled as shown in the second configuration (labeled with the number 2 in a circle) in FIGS. 8B-8C using appropriate switches at the end of the BL and DBL. The dynamics of the internal charges Q of two coupled cells subjected to a couple of synchronized voltage pulses depends on the initial combination of internal charges of these cells. In this way, the final values of the internal charges can be considered as a result of a logic operation over initial values stored at t=0 in these cells. As a specific example, the second configuration from the top of FIG. 8B is considered and −0.73V and 0.73V are amplitude voltage pulses are applied to the memory cells. FIGS. 8E-8G demonstrates the evolution of Q for both cells. Each line is referred to a different initial couple of bits written in cell A and B: solid line is (1,1) (i.e. bit 1 initially written in cell A and bit 1 initially written in cell B), dashed line (1,0), dotted line (0,1) and dashed dotted line (0,0).

The final values of Q in cells A and B realize OR and AND gates, respectively, as shown in FIGS. 8E and 8G. The dissipated energy (FIGS. 8F and 8H) is low as in the other examples discussed, being is less than 2 fJ in the worst case scenario, and, in the case of (1, 0) initial configuration, it is much lower. After computation, the bits stored in the cells are only partially written and the computation process is completed by a REFRESH process, thus increasing the total required energy per operation of a few fJ, dependent on the characteristics of the VSA.

Figure 8J:
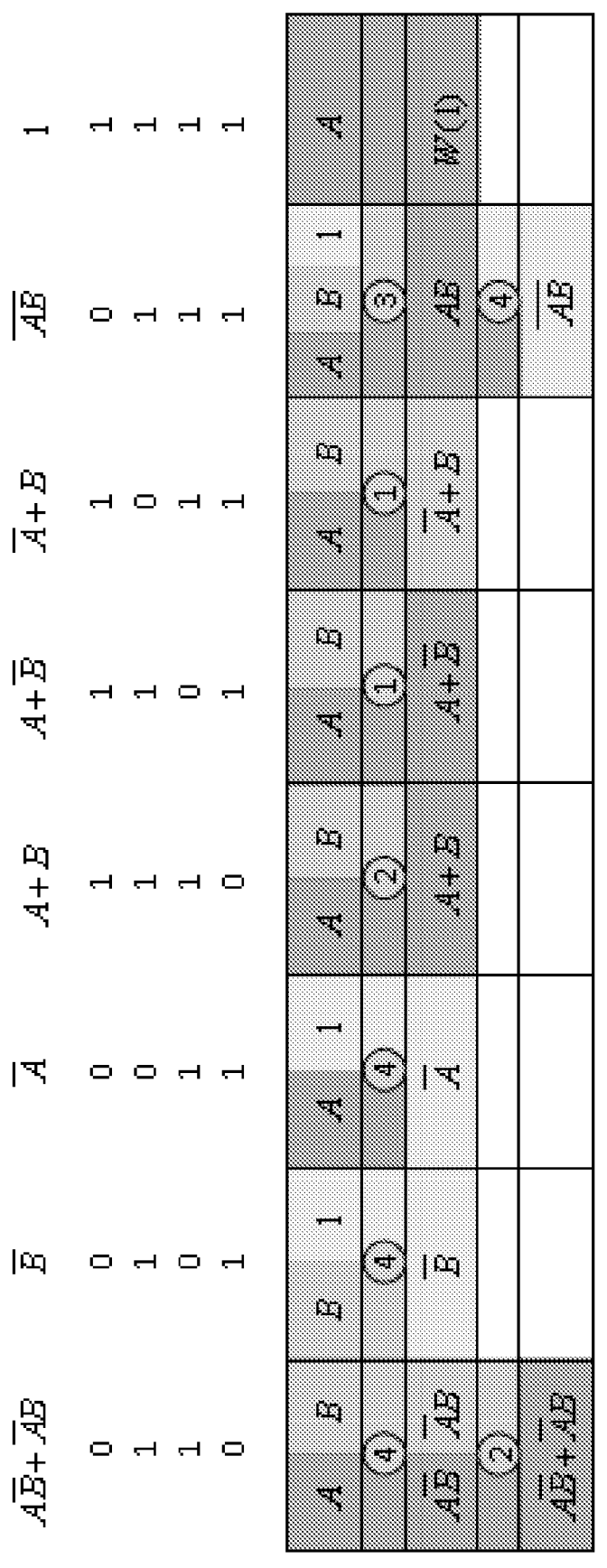

The discussed ability to perform six different two-bit and three-bit operations with different cell couplings will be explained with respect to FIGS. 8I-8O. FIGS. 8I and 8J illustrate possible two-bit logic operations for the DCRAM cells. An additional bit is set to 1 for negation. W(1) and W(0) stand for the operation WRITE 1 and 0, respectively. In the worst case scenario, a three-bit registry (three cells) is needed (the third bit, initially set to 1, is used to perform negation), and a two-level operation is required. Compared with CMOS NAND logic or NOR logic, DCRAM logic circuits require fewer components. In fact the commonly used CMOS NAND or NOR logic gates require up to 5-level operation scheme, and up to 20 transistors to perform the same set of two-bit functions.

Figure 8K:
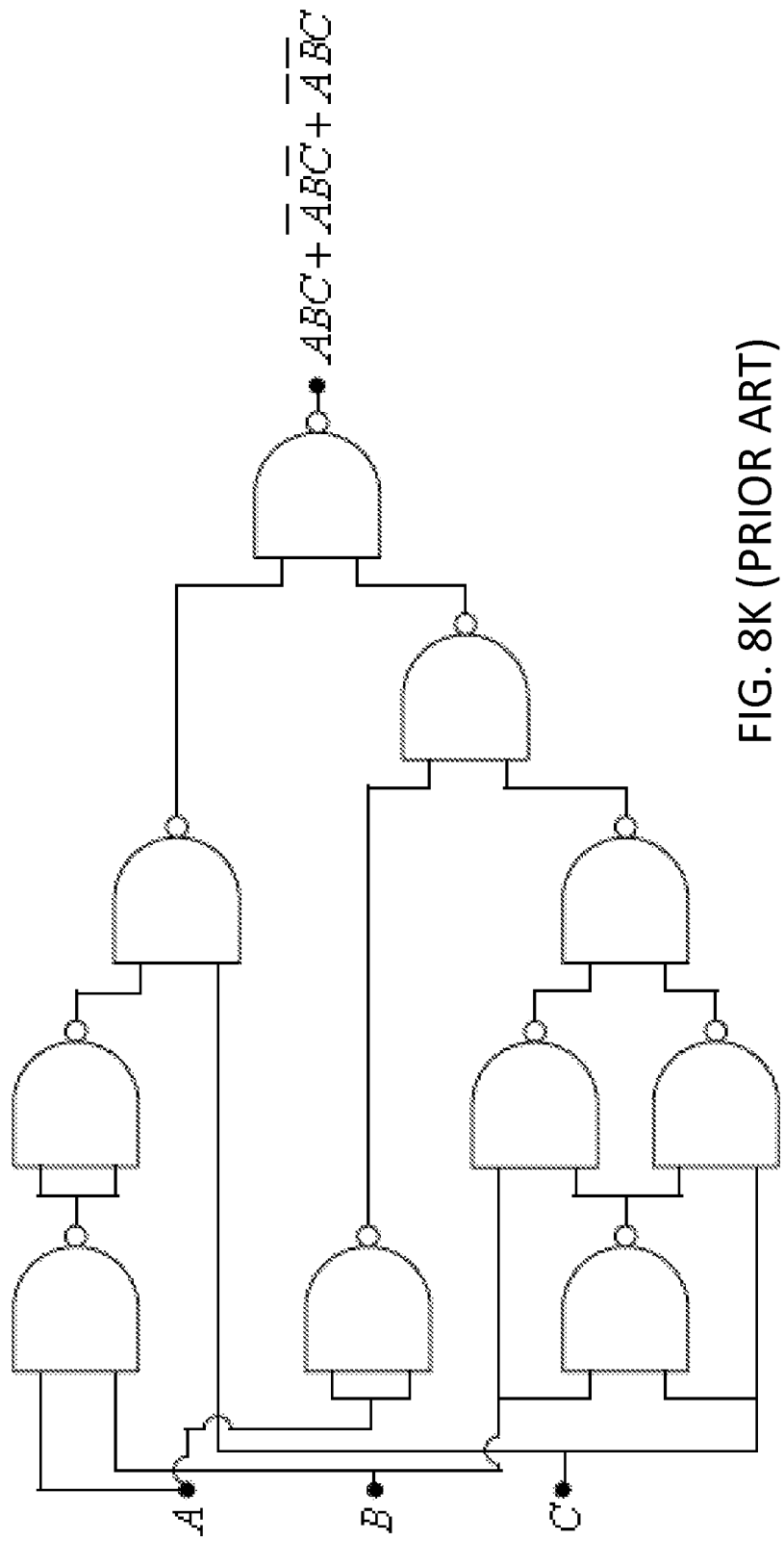
FIGS. 8K (PRIOR ART) and 8L compare an ability of the invention (FIG. 8L) to perform n-bit operations in accordance with FIGS. 8A-8C to conventional CMOS-NAND (FIG. 8K)

FIGS. 8K (PRIOR ART) and 8L compare an ability of the invention to perform n-bit operations using three gates with convention CMOS-NAND. The CMOS-NAND is shown in FIG. 8K. A 5-bit registry is made of the A, B and C inputs and two additional bits, one set to 1 employed for negation and the other equal to one of the three inputs A, B or C (depending on the sought for logic function), and any three-bit logical operation can be performed using, at most, a 4-level operation. In FIG. 8L, the example of 4-level three-bit operations is shown. In this case, the registry is composed by the three inputs (A, B and C) and only one additional bit (in this case A), because no bit for negation is required. FIG. 8K illustrates that using CMOS NAND logic, the same operation would be performed within a 5-level operation scheme using 10 NAND gates, i.e., 40 transistors, thus proving that the complexity of the CMOS circuit is much higher than for the present example DCRAM implementation. We have determined that to perform any 3-bit logic operation using the gates of FIG. 8C, a 5 bit registry is needed. FIG. 8L provides an example of a three bit operation where the bit used for negation is not included because is useless for this actual logic function.

Three cell connection logic is illustrated in FIGS. 9A-9C. The regions for operation are the same as in FIGS. 8A-8C, but the number of logic operations and parallelism are substantially increased by involving three passive two-terminal cells in the operations.

FIGS. 9D-9F illustrate two level cell operations in which connections are fixed, and not switched. The function AB+ $\overline{AB}$ is provided using three connected memory cells. Logic is achieved by varying the pulse amplitudes applied to the cells. Two different logic outputs can be obtained for each memory cell, defined as the logic outputs of the first and second operational level. At each computation step, the REFRESH and WRITE processes are performed to prepare the cells for the next computation step. This enables a universal gate capable of performing any two-bit logic operation without changing the topology (no switching) of the circuit from that illustrated in FIG. 9D. In FIGS. 9E and 9F, the bits 1, A and B are initially written in the three memory cells (registry). Then, apply the synchronized voltage pulses V1 and V2 with amplitude 1.15 V and −1.15 V, respectively, to obtain the gate of the first kind. The gate is polymorphic, so the same gate (depending on the applied voltage) can perform two different operations without switching the connections, so we have two kinds of operation. The first-level operation is completed by the REFRESH of the second and third memory cells and by writing 1 in the first one. Then, the second-level operation implements the gate of the second kind, and the boolean function AB+$\overline{AB}$ is obtained.

Figure 9G:
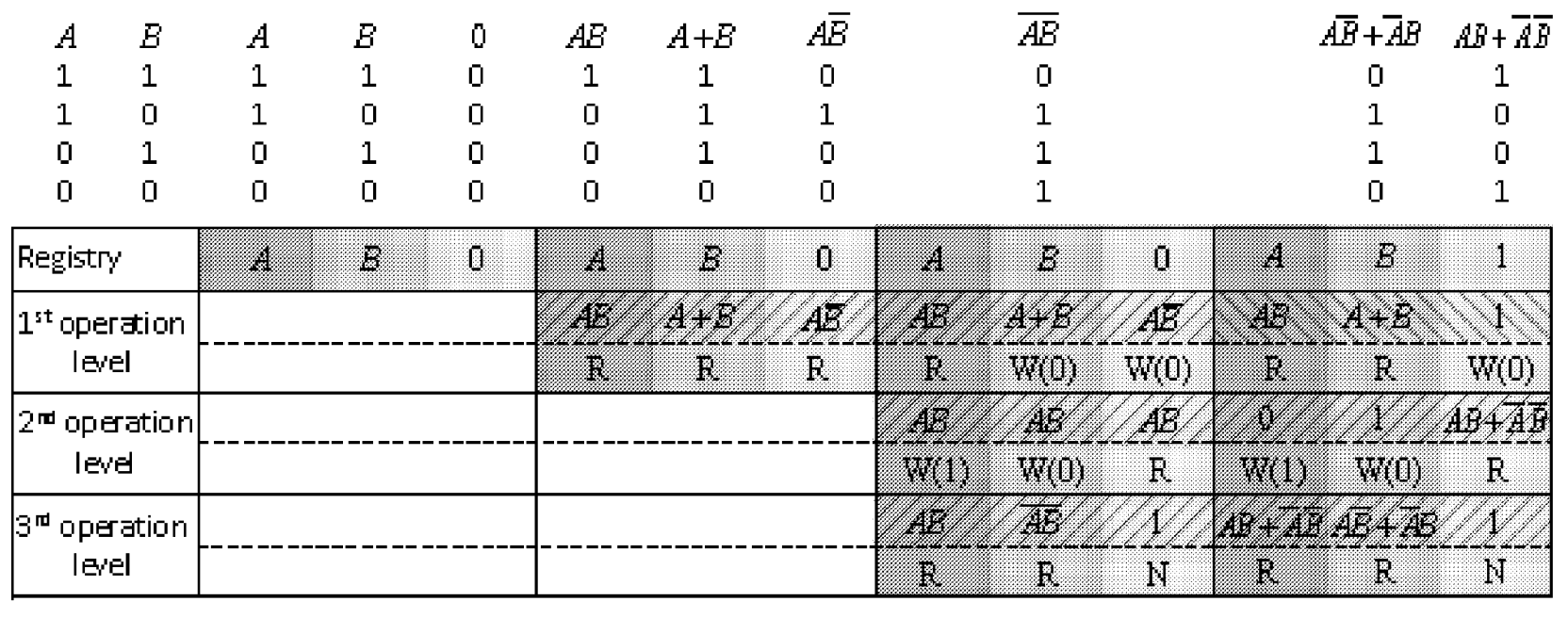
Figure 9H:
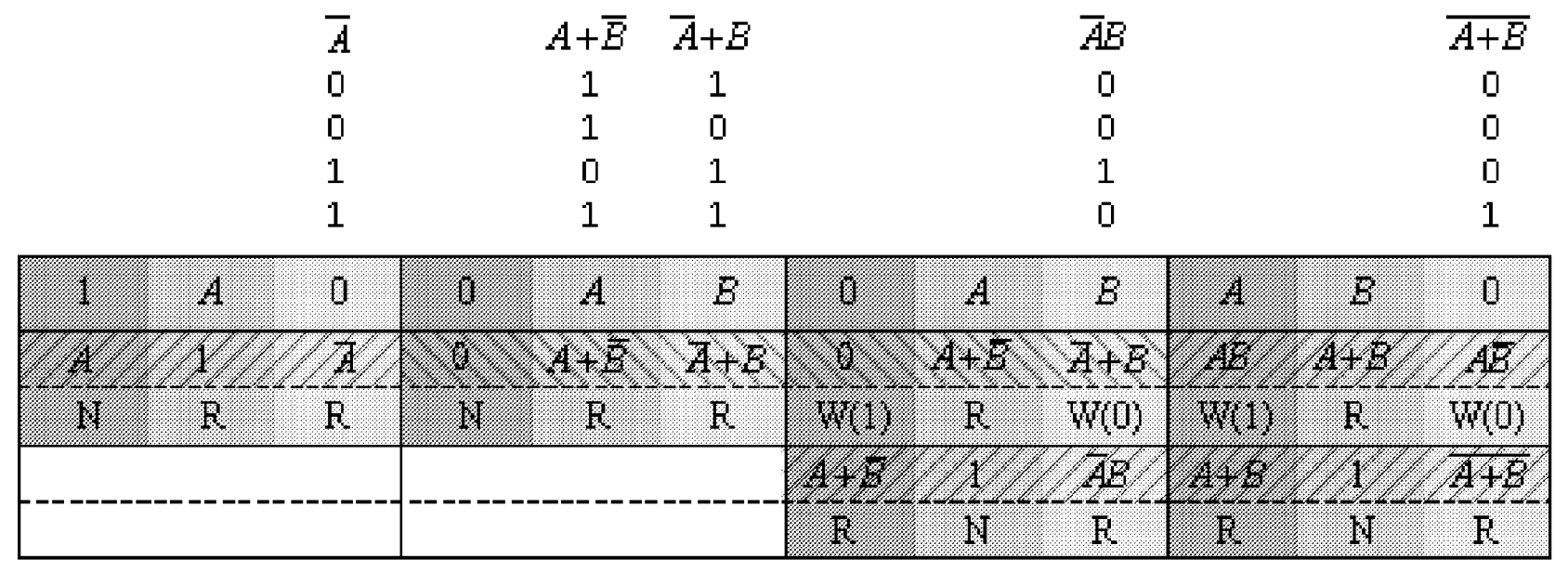

Similarly, FIGS. 9G and 9H illustrate the same approach for fixing connections of three cells. Instead of switching cells, logic is achieved by variation of voltage pulses. FIG. 9H is a continuation of the table in FIG. 9G. W(1) and W(0) again stand for the operation WRITE 1 and 0 respectively and R=REFRESH. The functions $\overline{B}$ and 1 are not shown, but are obtained as in the fifth column for $\overline{A}$ and in the first column for 0, respectively.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A circuit for mixed memory storage and polymorphic computing, comprising:
   a plurality of memory cells each selectively or fixedly connected to a word line, bit line and dual bit line, wherein each memory cell includes a memcapacitive element;
   voltage pulse generators for selectively applying voltage pulses the memory cells; and
   control circuitry apply to control the voltage pulse generators conduct at least one logic operation using two or more of the memory cells,
   wherein the at least one logic operation is performed according to a logic map providing logic necessary for computation.

2. The circuit of claim 1, further comprising sense amplifiers for refreshing reading contents of the memory cells.

3. The circuit of claim 1, wherein the memory cells are selectively connected via a switch.

4. The circuit of claim 1, wherein the memcapacitive element comprises a solid state element.

5. The circuit of claim 2, wherein the solid state element comprises a memcapacitor having a plurality of metal layers separated by dielectric including a central low-K dielectric layer and outer high-K dielectric layers.

6. The circuit of claim 1, wherein each of the memory cells comprise a FET transistor connected to a word line and a first side of the memcapacitive element; and wherein an opposite side of the memcapacitive element is connected to a bit line.

7. The circuit of claim 1, wherein the control circuitry conducts a simultaneous storage and logic operation using two or more of the memory cells.

8. The circuit of claim 7, wherein the control circuitry controls the voltage pulse generators to distribute charges in the memcapacitive elements of at least two memory cells according to a desired logic function.

9. The circuit of claim 8, wherein an output of the desired logic function is stored in one of the at least two memory cells.

10. The circuit of claim 8, wherein an output of the desired logic function is stored in a third memory cell.

11. The circuit of claim 8, wherein the control consists of applying voltage pulses without switching connections of the at least two memory cells.

12. The circuit of claim 6, wherein the control comprises applying voltage pulses and switching connections of the at least two memory cells.

13. The circuit of claim 12, wherein the switching comprises connecting the at least two memory cells with a common word line, floating the bit lines, setting an output of a memcapacitive element initially to 1 and applying different amplitude voltage pulses at the dual bit lines.

14. The circuit of claim 1, wherein the control circuit stores information in the internal state of the memcapacitive element of a memory cell.

15. A method for mixed memory storage and polymorphic computing in at least two memory cells each having a memcapacitive element, comprising:
   storing data by selectively applying voltage pulses to an individual memory cell to set an internal charge level of the memcapacitive element; and
   conducting logic functions by applying voltage pulses having independent amplitudes to at least two memory cells to achieve internal charges in the memcapacitive elements of the cells to store an output bit according to a logic map that depends upon applied independent voltage pulse amplitudes, the logic map providing logic necessary for computation.

16. A circuit for mixed memory storage and polymorphic computing, comprising:
   a plurality of memory cells each selectively or fixedly connected to a word line, bit line and dual bit line, wherein each memory cell includes a memcapacitive element;
   voltage pulse generators for selectively applying voltage pulses the memory cells; and
   control circuitry apply to control the voltage pulse generators to conduct at least one logic operation using two or more of the memory cells,
   wherein the at least one logic operation is performed according to a logic map providing logic necessary for computation, and wherein each of the memory cells comprise a FET transistor connected to a word line and a first side of the memcapacitive element; and wherein an opposite side of the memcapacitive element is connected to a bit line.

17. A circuit for mixed memory storage and polymorphic computing, comprising:
   a plurality of memory cells each selectively or fixedly connected to a word line, bit line and dual bit line, wherein each memory cell includes a memcapacitive element;
   voltage pulse generators for selectively applying voltage pulses the memory cells; and
   control circuitry apply to control the voltage pulse generators to conduct at least one logic operation using two or more of the memory cells,
   wherein the at least one logic operation is performed according to a logic map providing logic necessary for computation, and
   wherein the control circuitry controls the voltage pulse generators to distribute charges in the memcapacitive elements of at least two memory cells according to a desired logic function.

* * * * *